United States Patent
Komiya et al.

(10) Patent No.: US 6,319,603 B1
(45) Date of Patent: *Nov. 20, 2001

(54) LIQUID CURABLE RESIN COMPOSITION

(75) Inventors: Zen Komiya; Yoshikazu Yamaguchi, both of Tsukuba; Tsuyoshi Watanabe, Yokkaichi; Takashi Ukachi, Ushiku, all of (JP)

(73) Assignees: DSM N.V., Heerlen (NL); JSR Corporation; Japan Fine Coatings Co., Ltd., both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,507

(22) Filed: Mar. 2, 1999

Related U.S. Application Data

(63) Continuation of application No. PCT/NL97/00498, filed on Sep. 1, 1997.

(30) Foreign Application Priority Data

Sep. 2, 1996 (JP) .................................................. 8-231967

(51) Int. Cl.$^7$ ................ G02B 6/04; G02B 6/16; G02B 6/44; C08G 59/22; C08G 65/26
(52) U.S. Cl. ................... 428/378; 385/114; 385/115; 385/123; 385/145; 522/114; 522/116; 522/117; 522/120; 522/121; 522/129; 522/122; 522/15; 522/25

(58) Field of Search .................................. 522/129, 130, 522/120, 121, 25, 114, 116, 117, 122, 31; 385/114, 115, 123, 145; 428/378

(56) References Cited

U.S. PATENT DOCUMENTS

| | | | |
|---|---|---|---|
| 4,090,936 | * | 5/1978 | Barton . |
| 4,156,035 | | 5/1979 | Tsao . |
| 4,717,605 | * | 1/1988 | Urban et al. . |
| 5,026,794 | * | 6/1991 | Ho et al. . |
| 5,336,563 | | 8/1994 | Coady . |
| 5,399,604 | * | 3/1995 | Sano et al. . |
| 5,476,748 | | 12/1995 | Steinmann . |
| 5,891,930 | * | 4/1999 | Lapin et al. . |

FOREIGN PATENT DOCUMENTS

3621477 * 1/1987 (DE) .

* cited by examiner

*Primary Examiner*—Susan W. Berman
(74) *Attorney, Agent, or Firm*—Pillsbury Winthrop LLP

(57) ABSTRACT

A liquid curable resin composition comprising (1) a (meth) acrylate polymer having a weight average molecular weight relative to polystyrene standard of at least about 5,000, (2) a ring-opening polymerizable monomer containing at least one epoxy group, and (3) a cationic photopolymerization initiator is disclosed. The composition produces cured products which exhibit superior heat resistance, excellent mechanical strength, and superb adhesive characteristics, and is suitable for use as a photo-curable adhesive, a photo-curable sealing material, a resin for optical three-dimensional molding, and a coating material for optical fibers, and optical fiber ribbon matrix.

21 Claims, No Drawings

LIQUID CURABLE RESIN COMPOSITION

This is a continuation of International application No. PCT/NL97/00498 Sep. 1, 1997 which designated to the U.S.

BACKGROUND OF THE INVENTION

1. Field of the Invention

The present invention relates to a liquid curable resin composition. More particularly, the present invention relates to a liquid photo-curable resin composition which upon radiation produces cured products which exhibit superior heat resistance, excellent mechanical strength, and superb adhesive characteristics. The composition is suitable as a photo-curable adhesive, a photo-curable sealing material, a resin for optical three-dimensional molding, and a coating material for optical fibers, optical fiber ribbon matrix, and the like.

2. Description of Prior Art

Among photo-curable resin compositions, acrylate-based resin compositions have been developed as a material with characteristics suitable for a variety of applications by blending urethane acrylate as a major component of acrylate monomers. On the other hand, epoxy-based photo-curable resin compositions are used for applications making good use of the excellent adhesive properties and the high heat resistance of the epoxy resin.

A coating material for optical fibers is one specific application of photo-curable resins. As the use of optical fiber cables advances, higher durability is demanded of the coating material. Specifically, there is a problem wherein coloring of the optical fiber coating materials may be so detonated due to poor durability of the coating material that it becomes difficult to differentiate one optical fiber cable from another with a different color by sight. This may cause problems in the maintenance of optical fiber cables. Deterioration in color visibility has been confirmed to be caused not only by the discoloration of the bundling materials, but also by the discoloration of the primary and secondary coating that cover the individual optical fibers.

High adhesive properties and superior durability sufficient to prevent discoloration are demanded for photo-curable adhesives depending on the application. In addition, optical characteristics must not change in adhesives used for glass lenses and adhesives used to join quartz glass and optical fibers.

Urethane acrylate-based materials used in photo-curable resin compositions which are used for a variety of applications are flexible materials possessing superior mechanical characteristics such as high tenacity. Epoxy-based materials, on the other hand, are used for applications requiring the excellent characteristics of the epoxy resin, such as high adhesive properties and superior heat resistance.

However, the epoxy-based materials possess inadequate tenacity, while the urethane acrylate-based materials lack heat resistance. There are no known materials which possess both the characteristics possessed by these two types of resin materials.

Accordingly, an object of the present invention is to provide a liquid curable resin composition which undergoes the least change in characteristics when exposed to heat and light, maintains its transparency or is more resistant to coloration, exhibits superior mechanical characteristics and excellent adhesive properties. Such a resin composition is preferably formulated as to be suitable as a photo-curable adhesive or a coating material for optical fibers.

SUMMARY OF THE INVENTION

This object of the present invention can be achieved in the present invention by a liquid curable resin composition comprising,
(1) a poly(meth)acrylate polymer having a weight average molecular weight relative to polystyrene standards of at least 5,000,
(2) a ring-opening polymerizable monomer containing at least one epoxy group, and
(3) a cationic photopolymerization initiator.

DETAILED DESCRIPTION OF THE INVENTION AND PREFERRED EMBODIMENTS

Preferred examples of the above-mentioned (meth) acrylate polymer (1) include homopolymers of a (meth) acrylate compound, copolymers of two or more (meth) acrylate compounds, or copolymers of at least one (meth) acrylate compound and at least one radically polymerizable vinyl compound.

Such a (meth)acrylate polymer (1) can be manufactured by the polymerization of at least one (meth)acrylate compound or the polymerization of at least one (meth)acrylate compound and a vinyl compound which is radically polymerizable with the (meth)acrylate compound in the presence of a radical polymerization initiator.

The polymerization reaction can be carried out without using a solvent. When the molecular weight of the resulting poly(meth)acrylate is large and the polymer has such high viscosity that it is difficult to handle it with ease, an epoxy group-containing monomer polymerizable by the ring-opening reaction, which is later described in detail, can be used as a solvent.

Examples of the (meth)acrylate compounds include (meth)acrylates containing an alicyclic structure, such as isobornyl(meth)acrylate, bornyl(meth)acrylate, tricyclodecanyl(meth)acrylate, dicyclopentanyl(meth) acrylate, dicyclopentenyl(meth)acrylate, cyclohexyl(meth) acrylate, and 4-butylcyclohexyl(meth)acrylate. Other suitable (meth)acrylate include those having an epoxy group. Such a (meth)acrylate compound comprises preferably one (meth)acrylate group, and one epoxy group, and such compound has a molecular wight of less than 400. Commercially available epoxy group-containing (meth)acrylates, include 3,4-epoxy cyclohexylmethyl (meth)acrylate and glycidyl (meth)acrylate. Other suitable acrylates include hydroxyl group-containing (meth)acrylates, such as 2-hydroxyethyl (meth)acrylate, 2-hydroxypropyl(meth)acrylate, and 2-hydroxybutyl(meth)acrylate; aminoalkyl(meth)acrylate such as diethylaminoethyl(meth)acrylate and 7-amino-3,7-dimethyloctyl(meth)acrylate; the compounds represented by the following formula (1), $$CH_2=C(R^1)-COO(R^2O)_m-R^3 \qquad (1)$$

wherein $R^1$ is a hydrogen atom or a methyl group, $R^2$ is an alkylene group having 2–6, preferably 2–4, carbon atoms, $R^3$ is a hydrogen atom, an alkyl group, an alkenyl group, an aryl group or an alkyl substituted aryl group having 1–24 carbon atoms preferably 1–16 carbon atoms, and m is an integer of 0–12, and preferably 0–8; and the compounds represented by the following formula (2),

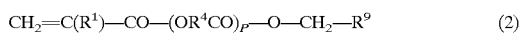
$$CH_2=C(R^1)-CO-(OR^4CO)_p-O-CH_2-R^9 \quad (2)$$

wherein $R^1$ is the same as defined above, $R^4$ is an alkylene group having 2–8, preferably 2–5, carbon atoms, $R^9$ is a tetrahydrofurfuryl group, and p is an integer of 1–8, and preferably 1–4.

The compounds represented by the above formula (1) include, for example, methyl(meth)acrylate, ethyl(meth)acrylate, propyl(meth)acrylate, isopropyl (meth)acrylate, butyl(meth)acrylate, amyl(meth)acrylate, isobutyl(meth)acrylate, t-butyl(meth)acrylate, pentyl(meth)acrylate, isoamyl(meth)acrylate, hexyl(meth)acrylate, heptyl(meth)acrylate, octyl(meth)acrylate, iso-octyl(meth)acrylate, 2-ethylhexyl(meth)acrylate, nonyl(meth)acrylate, decyl (meth)acrylate, iso-decyl(meth)acrylate, undecyl(meth) acrylate, dodecyl(meth)acrylate, lauryl(meth)acrylate, stearyl(meth)acrylate, iso-stearyl(meth)acrylate, butoxyethyl(meth)acrylate, ethoxydiethylene glycol(meth)acrylate, benzyl(meth)acrylate, phenoxyethyl(meth)acrylate, ethoxylated nonylphenol acrylate, propoxylated nonylphenol acrylate, polyethylene glycol mono(meth)acrylate, polypropyleneglycol mono(meth)acrylate, methoxydiethylene glycol(meth)acrylate, ethoxyethyl(meth)acrylate,methoxypolyethylene glycol(meth)acrylate, methoxypolypropylene glycol(meth)acrylate, polypropyleneglycol mono(meth)acrylate, methoxydiethylene glycol (meth)acrylate, ethoxyethyl(meth)acrylate, methoxypolyethylene glycol(meth)acrylate, and methoxypolypropylene glycol(meth)acrylate. Tetrahydrofurfuryl(meth)acrylate is given as an example of the compounds represented by the above-mentioned formula (2).

Among the above-described (meth)acrylate compounds, the (meth)acrylate compounds containing an epoxy group can be used as one of the reactants in the manufacture of the poly(meth)acrylate polymer, so that the polymer comprises epoxy groups, for the purpose of accelerating the grafting reaction between the second component (the ring-opening polymerizable monomer containing an epoxy group) and the first component (the poly(meth)acrylate polymer), during the final cure of the product.

When a (meth)acrylate compound containing an epoxy group is used in the manufacture of the first component, the amount preferably is more than 0.1 wt. %. Generally, the amount will be less than 100 wt. %, preferably less than 50 wt. % and particularly preferred 1–30 wt %, of the total weight of the (meth)acrylate polymer. If this amount is less than 0.1 wt %, the effect of accelerating the grafting reaction is impaired; if more than 50 wt %, the composition tends to be fragile.

(Meth)acrylate compounds can be obtained as commercially available products under the trademarks such as Aronix M111, M113, M114, M117 (manufactured by Toagosei Chemical Industry Co., Ltd.); KAYARADTCl 10S, R629, R644 (manufactured by Nippon Kayaku Co., Ltd.); Viscoat 3700 (manufactured by Osaka Organic Chemical Industry, Ltd.), and the like.

A radically polymerizable vinyl compound other than the (meth)acrylate compounds mentioned above can be used as the polymerization component for producing the (meth)acrylate polymer.

Given as examples of the radically polymerizable vinyl compounds are (meth)acrylamide compounds, such as (meth)acryloyl morpholine, diacetone(meth)acrylamide, iso-buthoxydimethyl(meth)acrylamide, N,N-dimethyl (meth)acrylamide, t-octyl(meth)acrylamide, N,N-diethyl (meth)acrylamide, and N,N-dimethylaminopropyl(meth) acrylamide; vinyl ether compounds, such as hydroxybutyl vinyl ether, lauryl vinyl ether, cetyl vinyl ether, and 2-ethylhexyl vinyl ether; N-vinyl group-containing lactam, such as N-vinyl pyrrolidone and N-vinyl caprolactam; styrene, α-methyl styrene, acrylonitrile, a vinyl chloride, vinyl acetate, maleic anhydride, fumaric acid ester, maleic acid ester, N-substituted maleimide compound, N-vinyl formamide, vinyl imidazole, and vinyl pyridine.

The radically polymerizable vinyl compounds may be used at a proportion of 0–0.7 mol, preferably 0–0.6 mol, for one mol of the (meth)acrylate compounds.

As a radical polymerization initiator used for the synthesis of (meth)acrylate polymer, a thermal polymerization initiator such as a peroxide or an azo compound is used when the polymerization is initiated by heating. Specific examples of such a polymerization initiator include methyl ethyl ketone peroxide, methyl isobutyl ketone peroxide, decanoyl peroxide, lauroyl peroxide, benzoyl peroxide, cumene hydroperoxide, di-t-butyl peroxide, t-butyl-oxybenzoate, azobis iso-butylonitrile, 2,2-azobis(2,4-dimethylvaleronitrile), 1,1'-azobis(cyclohexane-1-carbonitrile), and the like.

A radical photo-polymerization initiator may be used in the synthesis of the (meth)acrylate polymer. In addition, a photo-sensitizer may be used as required. Examples of radical photo-polymerization initiators include 1-hydroxycyclohexylphenyl ketone, 2,2-dimethoxy-2-phenylacetophenone, xanthone, fluorenone, benzaldehyde, fluorene, anthraquinone, triphenylamine, carbazole, 3-methylacetophenone, 4-chlorobenzophenone, 4,4'-dimethoxybenzophenone, 4,4'-diaminobenzophenone, Michler's ketone, benzoin propyl ether, benzoin ethyl ether, benzyl methyl ketal, 1-(4-isopropylphenyl)-2-hydroxy-2-methylpropan-1-one, 2-hydroxy-2 methyl-1-phenylpropan-1-one, thioxanethone, diethylthioxanthone, 2-isopropylthioxanthone, 2 chlorothioxanthone, 2-methyl-1-[4-(methylthio)phenyl]2-morpholino-propan-1-on, 2,4,6-trimethylbenzoyl diphenylphosphine oxide, bis-(2,6-dimethoxybenzoyl)-2,4,4-trimethylpentylphosphine oxide; IRGACURE 184, 369, 651, 500, 907, CGl 1 700, (CGI1750, CGI1850, CG24–61 (manufactured by Ciba Geigy); Lucirin LR8728 (manufactured by BASF); Darocure 1116, 1173 (manufactured by Merck Co.); and Ubecryl P36 (manufactured by UCB).

Given as examples of the photo-sensitizers are triethylamine, diethylamine, N-methyldiethanoleamine, ethanolamine, 4-dimethylaminobenzoic acids, methyl 4-dimethylaminobenzoate, ethyl 4-dimethylaminobenzoate, isoamyl 4-dimethylaminobenzoate; Ubecryl P102, 103, 104, 105 (manufactured by UCB), and the like.

When heat and radiation are used in combination to cure the (meth)acrylate polymer, a photo-polymerization initiator can be used in combination with the above-mentioned thermal polymerization initiator.

It is desirable for the polymerization initiators to be added to the composition in an amount of 0.1–10 wt %, particularly 0.5–7 wt %.

A molecular weight modifier can be used when the (meth)acrylate polymer is manufactured by radical polymerization. Thiol compounds and allyl compounds are given as preferable molecular weight modifiers. Specific examples of thiol compounds include methane thiol, ethane thiol, propane thiol, butane thiol, thiophenol, t-dodecyl mercaptan, and the like. A dimer of a-methyl styrene is given as a preferable example of the allyl compound.

The (meth)acrylate polymer manufactured in this manner has a weight average molecular weight, relative to polystyrene standard, of about 5,000 to about 400,000. When the weight average molecular weight is less than about 5,000, it is difficult for the cured products to have good tenacity; if more than about 400,000, on the other hand, the viscosity of the resulting composition is so high that difficulties may be encountered when the composition is used as a coating.

It is desirable that the (meth)acrylate polymer is incorporated into the composition of the present invention in an amount of 10–90 wt %. An amount in the range of 20–70 wt % is particularly preferred in order to maintain excellent coatability when the composition is coated on optical fibers and to ensure flexibility and long-term reliability of the cured products. More in particular, the amount of poly(meth) acrylate polymers is higher than about 30 wt. %.

In addition to these (meth)acrylate polymers, a ring-opening polymerizable monomer which contains at least one epoxy group is used in the resin composition of the present invention. Such a monomer in general will have a molecular weight of about 1000 or less, preferably about 700 or less. Preferably, this monomer has two or three epoxy groups.

Examples of such a ring-opening polymerizable monomer containing an epoxy group include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexyl methyl-3,4-epoxycyclohexane carboxylate, 2-(3,4-epoxycyclohexyl-5,5-spiro-3,4-epoxy) cyclohexane-metha-dioxane, bis(3,4-epoxycyclohexylmethyl) adipate, vinylcyclohexene oxide, 4-vinylepoxy cyclohexane, bis(3,4-epoxy-6-methylcyclohexyl methyl)adipate, 3,4-epoxy-6-methylcyclohexyl-3,4-epoxy-6-methylcyclohexane carboxylate, methylenebis(3,4-epoxycyclohexane), dicyclopentadiene diepoxide, di-3,4-epoxycyclohexane carboxylate of ethylene glycol, dioctyl epoxy hexahydrophthalate, di-2-ethylhexyl epoxy hexahydrophthalate, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ether, polyglycidyl ethers of a polyether polyol obtained by the addition of one or more alkylene oxides to an aliphatic polyhydric alcohol such as ethylene glycol, propylene glycol, or glycerol; diglycidyl esters of an aliphatic long-chain dibasic acid; mono glycidyl ethers of aliphatic higher alcohols; mono glycidyl ethers of phenol, cresol, or butyl phenol; mono glycidyl ethers of an alcohol of a polyether obtained by the addition of one or more alkylene oxides to phenol, cresol, or butyl phenol; glycidyl ester of a higher fatty acid, epoxidized soybean oil, epoxy butyl stearate, epoxy stearin octyl, epoxidized linseed oil, epoxidized polybutadiene, and the like.

Out of these, especially preferred are bisphenol A diglycidyl ether, bisphenol F diglycidyl ether, hydrogenated bisphenol A diglycidyl ether, hydrogenated bisphenol F diglycidyl ether, 3,4-epoxycyclohexyl methyl-3,4-epoxycyclohexane carboxylate, bis(3,4-epoxycyclohexyl methyl)adipate, 1,4-butanediol diglycidyl ether, 1,6-hexanediol diglycidyl ether, glycerol triglycidyl ether, trimethylolpropane triglycidyl ether, polyethylene glycol diglycidyl ether, and polypropylene glycol diglycidyl ether.

These compounds containing an epoxy group can be used either individually or in combination of two or more, and incorporated in an amount of 5 to 300 wt %, preferably to 200 wt %, and more preferably 10 to 100 wt %, to the total weight of the (meth)acrylate polymer. If more than 300 wt %, there is no difference in the characteristics of the resulting cured resin composition and normal epoxy cured products and the tenacity tends to be lost; if less than 10 wt %, the modulus of elasticity of the cured product tends to be decreased.

Given as examples of commercially available products of these epoxy compounds are UVR-6100, UVR6105, UVR-6110, UVR-6128, UVR-6200, UVR-6216 (manufactured by Union Carbide Corp.); Seloxide 2021, Seloxide 2021P, Seloxide 2081, Seloxide 2083, Seloxide 2085, Seloxide 2000, Seloxide 3000, Glycidole, AOEX24, Cyclomer A200, Cyclomer M100, Epolead GT-300, Epolead GT-301, Epolead GT-302, Epolead GT-400, Epolead 401, Epolead 403 (Daicell Co., Ltd.); and Epicoat 828, Epicoat 812, Epicoat 1031, Epicoat 872, Epicoat CT508.

As mentioned above, the ring-opening polymerizable monomers containing an epoxy group can be used as a solvent for manufacturing the (meth)acrylate polymer. When used as the solvent, these monomers can be used as the second component of the resin composition of the present invention as is. In this case, the ring-opening polymerizable monomer containing an epoxy group is used in an amount of 10 to 90 wt %, particularly preferably 20 to 80 wt %, in the total amount of the resin composition according to the present invention.

The resin composition of the present invention contains a cationic photo-polymerization initiator. The cationic photo-polymerization initiator is a compound capable of releasing a substance to initiate a cationic polymerization reaction when exposed to irradiation energy such as light. Particularly preferred cationic photo-polymerization initiators are onium salts which can release a Lewis acid by irradiation. These compounds are exemplified by the following formula (3), $$[R^5_a R^6_b R^7_c R^8_d Z]^{+m} [MX_n]^{-m} \qquad (3)$$

In the formula, the cation is an onium; Z is S, Se, Te, P, As, Sb, Bi, I, Br, Cl, or N≡N; $R^5$, $R^6$, $R^7$, and $R^8$ may independently be either the same or different organic groups; a, b, c, and d individually represent an integer of 0 to 3, provided that a+b+c+d is equal to the valence of Z; M is a metal or metalloid which is the central atom of the halide complex, such as, for example, B, V, Cr, Mn, or Co; X is a halogen atom; m is a net electric charge of the halide complex ion; and n is the number of the halide atoms in the halide complex ion.

Given as specific examples of the anion $MX_n$ in the above-mentioned formula (3) are tetrafluoro borate ($BF_4^-$), hexafluoro phosphate ($PF_6^-$), hexafluoro antimonate ($SbF_6^-$), hexafluoro arsenate ($AsF_6^-$), hexachloro antimonate ($SbCl_6^-$), anions represented by the general formula $MX_n(OH)^-$, perchloric acid ion ($ClO_4^-$), trifluoromethane sulfonic acid anion, trinitrobenzene sulfonic acid anion, trinitrotoluene sulfonic acid anion, and the like.

Among the onium salts particularly effective for use as the cationic polymerization initiator are aromatic onium salts such as aryl diazonium salt, diaryl iodonium salt, triaryl sulfonium salt, triaryl serenonium salt, dialkylphenacyl sulfonium salt, triaryl sulfonoxonium salt, aryloxydiaryl sulfonoxonium salt, dialkylphenacyl sulfonoxonium salt, and the like. As anions for these salts, non-nucleophilic chemical species such as tetrafluoro borate, hexafluoro phosphate, hexafluoro arsenic, and hexafluoro antimonate, and are given as examples. Iron/arene complexes can also be used and ferrocenyl hexafluoro phosphate can be given as a specific example.

Given as examples of commercially available products of these cationic photopolymerization initiators are UVI-6950, UVI-6970, UVI-6974, UVI6990 (manufactured by Union Carbide Corp.), Adekaoptomer SP-150, SP-151, SP-170, SP-171 (manufactured by Asahi Denka Kogyo Co., Ltd.), Irgacure 261 (manufactured by Ciba Geigy), CI-2481, CI-2624, CI-2639, CI-2064 (manufactured by Nippon Soda Co., Ltd.), CD-1010, CD-1011, CD-1012 (manufactured by Satomer Co., Ltd.), and DTS-102, DTS-103, NAT-103, NDS-103, TPS-103, MDS-103, MPI-103, BBI-103 (manufactured by Green Chemical Co., Ltd.). Of these commercially available products, UVI-6970, UVI-6974, Adekaoptomer SP-170, SP-171, CD-1022, and MPI-103 are particularly preferred.

These cationic photopolymerization initiators can be used either individually or in combination of two or more, and incorporated in an amount of 0.1 to 10 wt % relative to the total composition, preferably 0.2 to 5 wt %, and more preferably 0.3 to 3 wt %. If less than 0.1 wt % is used, there is a tendency that curability is impaired and a sufficient machine strength cannot be obtained; if more than 10 wt % is used, thick films which may be cured only insufficiently are obtained.

A photo-sensitizer, such as thioxanethone or its derivative, anthraquinone or its derivative, anthracene or its derivative, perylene or its derivative, benzophenone, and benzoin isopropyl ether, can be used in combination with these cationic photo-polymerization initiator.

Beside the above-mentioned components, the composition may comprise at least one radically polymerizable monomer comprising at least one ethylenically unsaturated group. Such a monomer in general will have a molecular weight of less than 1000.

Examples of suitable monofunctional monomers are the (meth)acrylate and vinyl monomers previously exemplified as the components for the synthesis of the (meth)acrylate polymer. These can be used either individually or in combination of two or more.

Poly-functional monomers can also be used as required. Given as examples of the poly-functional monomers are trimethylolpropane tri(meth)acrylate, pentaerythritol tri(meth)acrylate, ethylene glycol di(meth)acrylate, tetra ethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, trimethylolpropane trioxyethyl (meth)acrylate, tris(2-hydroxyethyl)isocyanurate tri(meth)acrylate, tris(2-hydroxyethyl)isocyanurate di(meth)acrylate, tricyclodecanedimethanol di(meth)acrylate, di(meth)acrylate of a diol which is an addition product of ethylene oxide or propylene oxide to bisphenol A, di(meth)acrylate of a diol which is an addition product of ethylene oxide or propylene oxide to hydrogenated bisphenol A, epoxy(meth)acrylate which is a (meth)acrylate addition product to diglycidyl ether of bisphenol A, and triethylene glycol divinyl ether. In addition, given as examples of commercially available products are Upimer UV S1002, SA2007 (manufactured by Mitsubishi Chemical Co., Ltd.); Viscoat 700 (manufactured by Osaka Organic Chemical Industry, Ltd.); KAYARADR-604, DPCA-20,-30,-60,-120, HX-620, D-310, D-330 (manufactured by Nippon Kayaku Co., Ltd.); and Aronix M-210, M-215, M-315, M-325 (manufactured by Toagosei Chemical Industry Co., Ltd.).

These mono-functional monomers and poly-functional monomers are added to the resin composition of the present invention in an amount of 1 to 50 wt % relative to the total composition.

When using the above-mentioned vinyl polymerizable monomers in the resin composition, it is desirable to add a photo-radical polymerization initiator. The same compounds as those previously given as the examples of the polymerization initiators for the synthesis of the (meth)acrylate polymer can be used as the photo-radical polymerization initiator. These polymerization initiators may be added to the composition in an amount of 0.1 to 10 wt %, preferably 0.2 to 5 wt %, and more preferably 0.3 to 3 wt %. If less than 0.1 wt %, there is a tendency that curability is impaired and sufficient machine strength cannot be obtained; if more than 10 wt %, thick films which may be cured only insufficiently may be obtained.

In addition to the above-described components various additives may be incorporated in the resin composition as required. Such additives may include, for example, antioxidants, colorants, UV absorbers, photo-stabilizers, silane coupling agents, thermal polymerization inhibitors, leveling agents, surfactants, preservatives, plasticizers, lubricants, solvents, fillers, aging preventives, wettability improvers, and coating surface improvers. Here, given as examples of antioxidants are Irganox 1010, 1035, 1076, 1222 (manufactured by Ciba Geigy), Antigen P, 3C, FR, GA-80 (manufactured by Sumitomo Chemical Industries Co., Ltd.); as examples of UV absorbers are Tinuvin P, 234, 320, 326, 327, 328, 329, 213 (manufactured by Ciba Geigy), Seesorb 102, 103, 501, 202, 712, 704 (manufactured by Sypro Chemical Co.); as examples of photo-stabilizers are Tinuvin 292, 144, 622LD (manufactured by Ciba Geigy), Sanol LS770 (manufactured by Sankyo Co., Ltd.), Sumisorb TM-061 (manufactured by Sumitomo Chemical Industries Co., Ltd.); and as examples of silane coupling agents are γ-amino-propyltriethoxysilane, γ-mercaptopropyltrimethoxysilane, γ-acryloxypropyltrimethoxysilane, and commercially available products, such as SH6062, 6030 (manufactured by Toray Silicone Co., Ltd.), and KBE903, 603, 403 (manufactured by Shin-Etsu Chemical Co., Ltd.).

The liquid curable resin composition of the present invention has a viscosity of 200 to 20,000 cP, and preferably 2,000 to 15,000 cP, at 25° C.

When the liquid curable resin composition of the present invention is used as a secondary coating material of optical fiber or a matrix or bundling material for a optical fiber ribbon matrix, it is desirable that the Young's modulus after cure be 5 to 250 kg/mm$^2$, preferably higher than 10 kg/mm$^2$, particularly 40 to 150 kg/mm$^2$. When used as a primary coating material for optical fiber, a desirable Young's modulus of the resin composition after cure is 0.05 to 0.3 kg/mm$^2$.

The liquid curable resin composition of the present invention can be cured by heat and/or radiation on a substrate as to obtain a coated substrate, or to use the resin composition as a photo-curable adhesive.

The liquid curable coating composition can be used in a process for coating a pristine drawn optical fiber with a primary coating and/or a secondary coating according this invention, followed by radiation curing of the coating.

It is also possible to use the resin composition of the present invention as matrix material in order to bind a plurality of coated and colored optical fibers together. A ribbon unit comprises generally 2–12 coated and colored optical fibers aligned in parallel.

The resin composition of the present invention can also be used as a bundling material as to bind a plurality of ribbons together. The bundle of ribbons generally comprises 2–12 ribbons.

For the purpose of this application, the term radiation is understood to include infrared light, visible light, ultraviolet light, X-rays, electron beam, α-rays, β-rays, γ-rays, and the like.

EXAMPLES

The present invention will be hereinafter described in more detail by way of examples which are given for illustration of the present invention and shall not to be construed as limiting the present invention.

Synthetic Example 1

Synthesis of Poly(meth)acrylate 50 parts by weight of n-butyl acrylate, 50 parts by weight of methyl methacrylate, and 100 parts by weight of 3',4'-epoxycyclohexyl methyl-3,4-epoxycyclohexane carboxylate were charged into a reaction vessel equipped with a stirrer. Then, after the addition of 1.0 part by weight of 2,2-azobis(2,4-dimethylvaleronitrile) as a polymerization initiator, the mixture was reacted at 60° C. for four hours while stirring. The resulting polymer solution was analyzed by GPC to determine the weight average molecular weight reduced to polystyrene, which was 120,000. This polymer solution is indicated as the polymer solution (1)-1.

Synthetic Example 2

Synthesis of poly(meth)acrylate

The same reaction as in the above-mentioned Synthetic Example 1 was carried out except that the amount of the polymerization initiator added was 2.0 parts by weight. The resulting polymer solution was analyzed by GPC to determine the weight average molecular weight reduced to polystyrene which was 48,000. This polymer solution is indicated as the polymer solution (1)-2.

Synthetic Example 3

Synthesis of poly(meth)acrylate 50 parts by weight of n-butyl acrylate, 45 parts by weight of methyl methacrylate, 5 parts by weight of 3,4-epoxycyclohexylmethyl acrylate (Cyclomer A200, manufactured by Daicell Co., Ltd.), and 2.0 parts by weight of t-dodecylmercaptan, as a molecular weight modifier, were charged into a reaction vessel equipped with a stirrer. Then, 100 parts by weight of 3,4'-epoxycyclohexylmethyl-3,4-epoxycyclohexane carboxylate (UVR-6110, manufactured by Union Carbide Corp.) was added. Then, after the addition of 1.0 part by weight of 2,2-azobis(2,4-dimethylvaleronitrile) as a polymerization initiator, the mixture was reacted at 60° C. for tour hours while stirring. The resulting polymer solution was analyzed by GPC to determine the weight average molecular weight reduced to polystyrene which was 36,000. The polymer was a (meth)acrylate polymer containing 5 wt % of copolymerized epoxycyclohexyl-methyl acrylate as the structural component. This polymer solution is indicated as the polymer solution (1)-3.

Synthetic Example 4

Synthesis of poly(meth)acrylate

The same reaction as in the above-mentioned Synthetic Example 4 was carried out except that the amount of t-dodecylmercaptan used as the molecular weight modifier was 3.0 parts by weight. The resulting polymer solution was analyzed by GPC to determine that the weight average molecular weight reduced to polystyrene which was 15,000. The polymer was a (meth)acrylate polymer containing 5 wt % of copolymerized epoxy cyclohexylmethyl acrylate as the structural component. This polymer solution is indicated as the polymer solution (1)-4.

Synthetic Example 5

Synthesis of Comparative Urethane Acrylate 5.5 parts by weight of tolylene diisocyanate, 42.0 parts by weight of a ring-opening copolymer of tetrahydrofuran and 3-methyl tetrahydrofuran with a number average molecular weight of 2,000, 0.01 parts by weight of 2,6-di-t-butyl-p-cresol which is a polymerization inhibitor were charged into a reaction vessel equipped with a stirrer. The mixture was cooled with ice to a 10° C. or lower temperature while stirring. When the liquid temperature was decreased to lower than 10° C., 0.04 parts by weight of dibutyl tin dilaurate was added and the mixture was stirred for two hours while controlling the temperature at 20–30° C. Then, 2.2 parts by weight of hydroxyethyl acrylate was added, followed by stirring for four hours at 50–60° C. The reaction was terminated when the amount of residual isocyanate became 0.1 wt % or less, thus obtaining a liquid resin urethane acrylate (hereinafter called urethane Acrylate UA-1).

Examples 1–5

Preparation of Liquid Curable Resin Compositions From Polymer Solutions (1)-1, (1)-2, (1)-3, and (1)-4

The components in the formulations shown in Table 1 (the numbers in the table indicates parts by weight of each component) were charged into a reaction vessel equipped with a stirrer. The mixtures were stirred for three hours while controlling the temperature at 50–60° C., to obtain liquid curable resin compositions.

Comparative Examples

Preparation of Comparative Liquid Curable Resin Compositions

The components in the formulation shown in Table 1 (the numbers in the table indicates parts by weight of each component) were charged into a reaction vessel equipped with a stirrer. The mixtures were stirred for three hours while controlling the temperature at 50–60° C., to obtain liquid curable resin compositions.

In Table 1, M220 indicates tripropylene glycol diacrylate available under the trademark of Aronix M220 (manufactured by Toagosei Chemical Industry Co., Ltd.), UVI-6970 indicates a cationic photopolymerization initiator (manufactured by Union Carbide Corp.) having the following chemical structure,

Test Examples

The liquid curable resin compositions prepared in the above examples were cured, made into test pieces, and evaluated according to the following methods.

1. Preparation of Test Pieces

Liquid curable resin compositions were applied to glass plates using an applicator bar to a thickness of 250 μm, and irradiated with ultraviolet light in the air at a dose of 1 J/cm². The cured films on the glass plates were subjected to a heating test and QUV heat resistance and light resistance tests.

2. Measurement of Color Chances

ΔE and YI values for test pieces were measured using a color-difference meter (Color Analyzer TC-1800N, manufactured by Tokyo Denshoku Co., Ltd.) to compare the color changes due to heating or light.

3. Heating Test and QUV Heat Resistance and Light Resistance Tests

Test pieces were heated in a thermostatically controlled bath at a temperature of 120° C. or irradiated with light using a QUV testing machine for 7–14 days. After this exposure, test pieces were measured for the YI, according to JIS Z8722.

4. Measurement of Viscosity

Viscosities of the liquid curable resin compositions were measured using a B-type viscosimeter at 25° C.

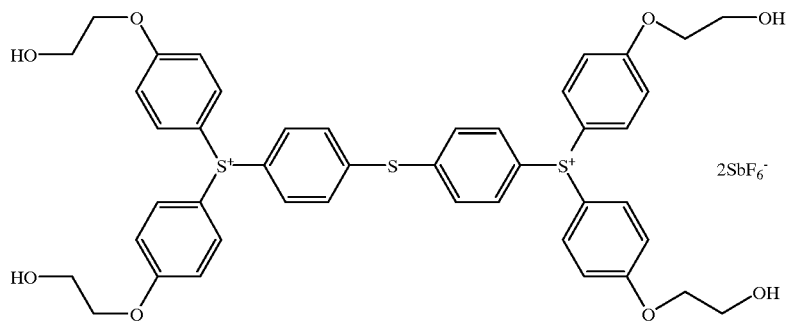

and Irgacure 184 indicates a radical photo-polymerization initiator manufactured by Ciba Geigy, being 1-hydroxy-cyclohexyl-phenylketone.

TABLE 1

| | Example 1 | Example 2 | Example 3 | Example 4 | Example 5 | Comparative Example 1 |
|---|---|---|---|---|---|---|
| Polymer solution | | | | | | |
| (1)-1 | 70 | — | — | — | — | — |
| (1)-2 | — | 70 | — | — | — | — |
| (1)-3 | — | — | 70 | 70 | — | — |
| (1)-4 | — | — | — | — | 70 | — |
| UA-1 | — | — | — | — | — | 70 |
| M220 | 28 | 28 | 28 | 28 | 28 | 27 |
| Irgacure 184 | 1 | 1 | 1 | 1 | 1 | 2 |
| UVI-6970 | 1 | 1 | 1 | 1 | 1 | 0 |

The results are shown in Table 2.

TABLE 2

|  | Example 1 | Example 2 | Example 3 | Example 4 | Example 5 | Comparative Example 1 |
|---|---|---|---|---|---|---|
| Liquid resin viscosity (cP) | 14,000 | 7,600 | 6,900 | 7,700 | 2,500 | 12,000 |
| Initial Value (YI) | 1.8 | 1.9 | 2.0 | 2.1 | 1.9 | 1.9 |
| QUV × 7 days | 2.1 | 2.6 | 2.3 | 2.4 | 2.5 | 20.4 |
| 120° C. × 14 days | 10.3 | 11.4 | 12.6 | 13.0 | 14.8 | 23.8 |

As clearly shown in Table 2, the cured products prepared from the compositions of the present invention exhibited only minimal changes in color under the conditions of high temperature or under irradiation with light, demonstrating their excellent durability. The liquid curable resin composition of the present invention is a material which can provide cured products with superior durability, exhibiting minimal color changes due to heat and light. Because of these characteristics and its superior coatability, the resin composition can improve productivity when used as a coating material for woods, plastic sheets, optical fibers, or the like. The products coated with the liquid curable resin composition have excellent durability.

What is claimed is:

1. A liquid curable resin composition comprising,
   (1) 10–90 wt. %, relative to the total composition, of a poly(meth)acrylate polymer comprising epoxy groups and having a weight average molecular weight of about 5,000–400,000,
   (2) a ring-opening polymerizable monomer selected from bisphenol A diglycidyl ether, bisphenol F diglycidyl ether, hydrogenated bisphenol A diglycidyl ether, 3,4-epoxycyclohexyl methyl-3,4-epoxycyclohexane carboxylate, bis(3,4-epoxycyclohexyl methyl)adipate, 1,4-butanediol diglycidyl ether, 1,6-hexanediol diglycidyl ether, glycerol triglycidyl ether, trimethylolpropane triglycidyl ether, polyethylene glycol diglycidyl ether and/or polypropylene glycol diglycidyl ether, and
   (3) a cationic photopolymerization initiator,
   (4) a radically polymerizable monomer comprising at least one ethylenically unsaturated group, and
   (5) a free radical photo-initiator.

2. Resin composition according to claim 1, wherein 1–30 wt. % of the polymer is provided by co-polymerization of (meth)acrylate monomers containing an epoxy group.

3. Resin composition according to claim 1, wherein at least one radically polymerizable vinyl compound is used at a proportion of 0–0.7 mol for one mol of the (meth)acrylate compounds in the manufacture of the poly(meth)acrylate polymer.

4. Resin composition according to claim 1, wherein the epoxy group containing monomer has a molecular weight of about 1000 or less.

5. Resin composition according to claim 1, wherein the epoxy group containing monomer has two or three epoxy groups.

6. Resin composition according to claim 1, wherein the cationic photopolymerization initiator is a compound according to the formula $$[R^5_a R^6_b R^7_c R^8_d Z]^{+m}[MX_n]^{-m} \quad (3)$$

wherein the cation is an onium; Z is S, Se, Te, P, As, Sb, Bi, I, Br, Cl, or N≡N; $R^5$, $R^6$, $R^7$, and $R^8$ may be either the same or different organic groups; a, b, c, and d individually represent an integer of 0 to 3, provided that a+b+c+d is equal to the valence of Z; M is a metal or metalloid which is the central atom of the halide complex, X is a halogen atom; m is a net electric charge of the halide complex ion; and n is a number of the halide atoms in the halide complex ion.

7. The composition of claim 6, wherein said metal or metalloid M comprises an atom selected from the group consisting of boron, vanadium, chromium, manganese, or cobalt.

8. Resin composition according to claim 1, wherein the cationic initiator is present in an amount of 0.1–10 wt. % relative to the total composition.

9. Resin composition according to claim 1, wherein the radically polymerisable monomer is present in an amount of 1–50 wt. % relative to the total weight of the composition.

10. Resin composition according to claim 1, wherein the composition further comprises suitable additives.

11. Resin composition according to claim 1, wherein the composition has a viscosity of 200 to 25,000 cP at 25° C.

12. The resin composition of claim 1, wherein said composition comprises, relative to the total weight of poly (meth)acrylate polymer, 10–200 wt. % of said ring-opening polymerizable monomer.

13. The resin composition of claim 1, wherein said resin composition is a photo-curable adhesive.

14. A process for using the liquid resin composition according to claim 13, comprising:
    applying the resin composition to a substrate.

15. Coated substrate wherein the coating is a cured coating, the coating before curing being a liquid curable resin composition according to claim 1.

16. Process for the preparation of a coated optical fiber comprising applying a liquid coating composition according to claim 1 on a pristine drawn optical fiber, and curing by radiation.

17. Optical fiber coated with at least one cured primary coating, the primary coating before curing being a resin composition according to claim 1, the cured primary coating having a Young's modulus of 0.05–0.3 kg/mm².

18. Process for the preparation of a coated optical fiber comprising applying a liquid curable composition according to claim 1 as secondary coating on an optical fiber, and curing by radiation.

19. Optical fiber coated with a primary coating and a secondary coating, the secondary coating before curing being a resin composition according to claim 1, the cured secondary coating having a Young's modulus of 10–250 kg/mm².

20. Optical fiber bundle comprising a plurality of optical fiber ribbons, bonded together with a bundling material, the bundling material being a cured coating, said coating before curing being a liquid curable resin composition according to claim 1, said cured coating having a Young's modulus of 5–250 kg/mm².

21. An optical fiber ribbon comprising a plurality of coated optical fibers bonded together with a matrix material having a Young's modulous of 5–250 kg/mm², the matrix curing material before curing being a liquid curable resin composition comprising:

(1) 10–90 wt %, relative to the total composition, of poly(meth)acrylate polymer comprising epoxy groups and having a weight average molecular weight of about 5,000–400,000, (2) a ring-opening polymerizable monomer selected from bisphenol A diglycidyl ether, bisphenol F diglycidyl ether, hydrogenated bisphenol A diglycidyl ether, 3,4-epoxycyclohecyl methyl-3,4-epoxycyclohexane carboxylate, bis(3,4-epoxycyclohexyl methyl)adipate, 1,4-butanediol diglycidyl ether, 1,6-hexanediol diglycidyl ether, glycerol triglycidyl ether, trimethylopropane triglycidyl ether, polyethylene glycol digylcidyl ether and/or polypropylene glycol diglycidyl ether, and (3) a cationic photomerization initiator.

* * * * *